United States Patent [19]
Negley

[11] Patent Number: 5,631,190
[45] Date of Patent: May 20, 1997

[54] METHOD FOR PRODUCING HIGH EFFICIENCY LIGHT-EMITTING DIODES AND RESULTING DIODE STRUCTURES

[75] Inventor: Gerald H. Negley, Hillsborough, N.C.

[73] Assignee: Cree Research, Inc., Durham, N.C.

[21] Appl. No.: 319,803

[22] Filed: Oct. 7, 1994

[51] Int. Cl.$^6$ .................................................. H01L 21/20
[52] U.S. Cl. ........................... 438/33; 117/95; 438/940
[58] Field of Search .............................. 437/127, 129, 437/905; 148/DIG. 95, DIG. 99; 117/951

[56] References Cited

U.S. PATENT DOCUMENTS

| | | |
|---|---|---|
| 3,626,141 | 12/1971 | Daly . |
| 3,824,678 | 7/1974 | Harris et al. . |
| 3,866,398 | 2/1975 | Vernon, Jr. et al. . |
| 3,991,296 | 11/1976 | Kojima et al. . |
| 4,224,101 | 9/1980 | Tijburg et al. . |
| 4,543,464 | 9/1985 | Takeuchi . |
| 4,626,613 | 12/1986 | Wenham et al. . |
| 4,783,421 | 11/1988 | Carlson et al. . |
| 5,185,295 | 2/1993 | Goto et al. . |
| 5,336,379 | 8/1994 | Chung et al. . |
| 5,450,434 | 9/1995 | Ota et al. ................................. 372/57 |
| 5,483,038 | 1/1996 | Ota et al. .......................... 219/121.69 |

OTHER PUBLICATIONS

R.J. Tench et al., "Clusters formed in laser-induced ablation of Si, SiC, Pt, $UO_2$ and evaporation of $UO_2$ observed by laser ionization time-of-flight mass spectrometry and scanning tunneling microscopy," J. Vac. Sci. Technol. B, vol. 9, No. 2, pt. 2, pp. 820–824, Mar.–Apr. 1991 (abstract only).

Primary Examiner—Robert Kunemund
Attorney, Agent, or Firm—Bell, Seltzer, Park & Gibson, P.A.

[57] ABSTRACT

A method of producing light emitting diodes from silicon carbide with increased external efficiency is disclosed which includes directing a beam of laser light at one surface of a portion of silicon carbide, and in which the laser light is sufficient to vaporize the silicon carbide that it strikes to thereby define a cut in the silicon carbide portion; and then dry etching the silicon carbide portion to remove by-products generated when the laser light cuts the silicon carbide portion. The resulting wafer and diode structure are also disclosed.

30 Claims, 1 Drawing Sheet

METHOD FOR PRODUCING HIGH EFFICIENCY LIGHT-EMITTING DIODES AND RESULTING DIODE STRUCTURES

FIELD OF THE INVENTION

The present invention relates to methods of manufacturing light-emitting diodes, and in particular, relates to a method of using laser light to cut individual diodes formed in silicon carbide and gallium nitride on silicon carbide substrate wafers.

BACKGROUND OF THE INVENTION

The term "laser" is an acronym for "light amplification by stimulated emission of radiation." Lasers produce beams of coherent monochromatic light in both the visible and other portions of the electromagnetic spectrum. Laser beams have extremely high energy resulting from their single wavelength and frequency. Because of their high energy, laser beams are used in a number of industrial applications for cutting difficult materials, or items that can or must be cut or scribed in extremely controlled patterns.

Accordingly, because the manufacture of semiconductor devices requires relatively precise tolerances and patterns on an extremely small scale, attempts have been made to use laser light to pattern, cut, or otherwise treat semiconductor materials during the manufacturing process. To date, these efforts have met with little success. The main problems appear to be twofold: first, the power of the laser light can damage the devices being manufactured. Second, the reaction between the laser light and the material being treated, particularly material being cut, produces byproducts that remain on the surface of the structure being manufactured and must be removed later. If removal techniques are unavailable or unsatisfactory, such byproducts can degrade or even ruin the resulting devices.

Light-emitting diodes (LEDs) are semiconductor devices that emit light, including visible light, when a potential difference is applied across a p-n junction structure. There are a number of ways to make light-emitting diodes and many associated structures, but these are generally well known, and the invention that will be described herein applies to most or all of them. Thus, they will not be discussed in detail hereafter except as necessary to explain the invention. By way of example, and not of limitation, Chapters 12–14 of *Sze, Physics of Semiconductor Devices*, 2d ed. (1981), gives a good explanation of a variety of photonic devices, including LEDs.

As is known to those familiar with semiconductor materials and the devices made from those materials, however, the color of light that can be produced by a light-emitting diode is generally limited by the characteristics of the semiconductor material, and most significantly by the bandgap. The bandgap represents the energy transition between the valence band and conduction band of individual atoms. In accordance with well-understood quantum mechanical principles, transitions between the valence band and the conduction band are limited to the precise bandgap, or to definite intermediate states related to the bandgap that are likewise characteristic of the material and its dopants or impurities.

Stated more simply, the bandgap of a material limits the color of light that it can emit based on the bandgap transitions that generate such light.

As is further well known to those familiar with semiconductor materials, light, and their interaction, the energy of a photon emitted by a transition is related to its frequency through the formula E=hv, where "E" is the energy of the photon, "h" is Planck's constant, and "v" is the frequency. Thus, the bandgap's energy width, usually expressed in electron volts ("eV"), limits the photons it can produce to certain energies and therefore certain frequencies.

In turn, the frequency of a photon is inversely related to its wavelength according to the formula $\lambda=c/v$, where "c" is the speed of light and "$\lambda$" is the resulting wavelength.

Because of these limitations, materials with smaller bandgaps can only produce longer wavelength, lower frequency photons, which fall towards the red (770–622 nm), orange (622–597 nm), and yellow (597–577 nm) portions of the visible spectrum. Light tends to begin to have a purer green color at about 525 nanometers, and thus a bandgap of approximately 2.36 eV is required in a semiconductor material before it can produce such photons. Similarly, a truer blue emission has a wavelength on the order of 470 nanometers and thus requires a bandgap of 2.64 eV or greater. It will be understood, of course, that the assignment of particular wavelengths to particular colors or to the boundaries between colors is somewhat arbitrary and should be taken as illustrative rather than absolute.

There are only a few semiconductor materials that have the appropriate bandgaps and can produce such light. Two such candidate materials are silicon carbide (2.86 eV for $\alpha$-SiC) and gallium nitride (3.36 eV).

The theoretical properties of silicon carbide have been recognized for some years, but only in the last decade has sufficient progress been made in techniques for bulk crystal growth, epitaxial growth, and device manufacture, much of it by the common assignee of this invention, to produce workable devices from silicon carbide. Silicon carbide has an extremely high melting point (about 2830° C.), is physically extremely hard (often used as an abrasive), and crystallizes in over 150 polytypes, most of which are separated by relatively small thermodynamic differences.

Gallium nitride and its related Group III nitrides (i.e., Group III of the periodic table) are other candidate materials, but to date no satisfactory method has been found for producing large bulk single crystals of gallium nitride or other Group III nitrides that could serve as appropriate device substrates. Thus, gallium nitride devices have typically been formed on sapphire ($Al_2O_3$), and more recently on silicon carbide.

Most of the successful efforts so far in producing LEDs that emit in the blue region of the spectrum have used a "mesa"-type structure. The term "mesa" generally defines a structure in which the base or substrate of a device has a larger cross-sectional area than the active area, which is typically formed by two or more epitaxial layers on the substrate. The conventional mesa structure provides a physical separation between active regions when a plurality of devices are manufactured on a single wafer, which presently is the most common method of producing such devices in large quantities. The space between mesas provides a portion at which the devices can be mechanically separated. Typically, mechanical separation is carried out with a tool of some sort capable of working with such hard materials, for example a diamond saw, or as more recently set forth in copending, commonly assigned application Ser. No. 08/290, 458, filed Aug. 15, 1994, an electrodischarge machine ("EDM"). Typically, EDM can be used to separate large bulk single crystals into substrate wafers, and a diamond saw is used to cut individual die from a wafer once devices have been formed on it.

In some circumstances, however, the mesa structure limits the efficiency of the manufacturing process and the resulting devices. The mesa structure lowers manufacturing efficiency because it tends to require a fairly large percentage of the area of a wafer in the form of the separation between individual mesas. Thus, to the extent that the separation between mesas can be reduced, the percentage area of the wafer that carries active device structures can be correspondingly increased. To date, however, the diamond saw remains a limiting factor in the extent to which mesa separation can be reduced.

Diamond saw-cutting also tends to produce relatively smooth finishes on the individual LED die, and these smooth surfaces tend to encourage internal reflection of light from an LED, rather than external emission. In this regard, it will be understood by those familiar with the devices, that the light is emitted from the junction of the device, and must travel to and leave the edges of the device in order to be visible. Thus, to the extent the light is internally reflected, it reduces the external quantum efficiency of the resulting device.

One technique for increasing the external efficiency is set forth in copending, commonly assigned application Ser. No. 08/081,688, filed Jun. 23, 1993, which describes an extended epitaxial layer for taking advantage of certain optical considerations in increasing the external efficiency of such diodes.

When attempting to use laser cutting with materials such as silicon carbide or gallium nitride, however, it has been found that the laser's action creates both expected and unexpected problems. The expected problems include unwanted byproducts and damage to the devices being formed. The unexpected problems arise from a disadvantage that is particularly characteristic of silicon carbide. Specifically, in other materials, damage to the device, and particularly to its crystal structure, can change the intensity of the color produced by the material, but not the color itself. In contrast, if certain types of damages are created in silicon carbide, particularly point defects, they tend to form recombination centers that change the visible emission of the resulting diode from blue to green. Thus, although green LEDs in silicon carbide are desirable when they can be produced in a controlled fashion (see e.g., copending application Ser. No. 08/290,020, filed Aug. 12, 1994), producing a green LED is quite disadvantageous when a blue-emitting LED is desired.

To date, there has been no satisfactory resolution of these problems with respect to laser cutting in general and laser cutting of silicon carbide and gallium nitride in particular.

OBJECT AND SUMMARY OF THE INVENTION

Therefore, it is an object of the present invention to provide a method of producing light-emitting diodes in silicon carbide and gallium nitride that have increased quantum efficiency, and that can be produced at a higher productivity level by eliminating the mesa structure and the techniques that necessarily produce the mesa structure.

The invention meets this object with a method of producing light-emitting diodes from silicon carbide with increased external efficiency. In a first aspect, the method comprises directing a beam of laser light at one surface of a portion of silicon carbide, and in which the laser light is sufficient to vaporize the silicon carbide that it strikes to thereby define a cut in the silicon carbide portion. The silicon carbide is then dry etched to remove byproducts generated when the laser light cuts the silicon carbide portion.

In another aspect, the invention comprises a high efficiency light-emitting diode comprising a silicon carbide substrate and at least two epitaxial layers on the substrate that form a p-n junction therebetween. The side edges of the epitaxial layers are coincident with the sidewalls of the substrate. Ohmic contacts are made to the junction to apply a potential across it, and the resulting diode is characterized in that the p-n junction produces an emission in the blue region of the visible spectrum when a potential is applied thereacross.

In a further aspect, the invention comprises a high efficiency light-emitting diode in which the coincident side edges of the epitaxial layers have reticulate surfaces.

In yet another aspect, the invention comprises a silicon carbide light-emitting diode precursor structure comprising a wafer formed of a silicon carbide substrate with at least two epitaxial layers thereon that define a p-n junction therebetween, and a plurality of trenches in the wafer.

The foregoing and other objects and advantages of the invention will become more apparent when taken in conjunction with the detailed description and the drawings in which:

DETAILED DESCRIPTION

Figure 1:
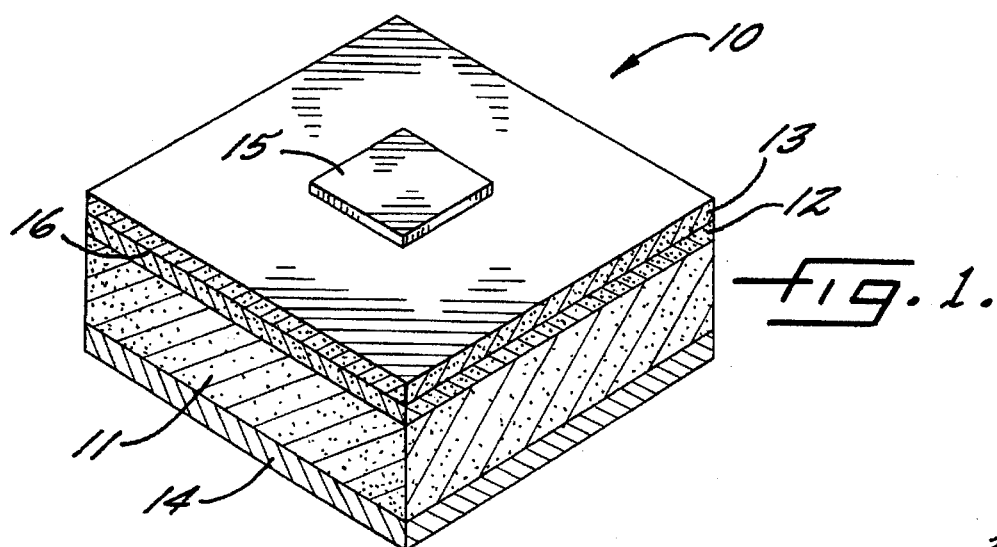
FIG. 1 is a perspective view of a light-emitting diode according to the present invention.

The invention is a method of producing light-emitting diodes from silicon carbide with increased external efficiency. In a first aspect, the method comprises directing a beam of laser light at one surface of a portion of silicon carbide, and in which the laser light is sufficient to vaporize the silicon carbide that it strikes to thereby define a cut in the silicon carbide portion. The method further comprises dry etching the silicon carbide portion to remove byproducts generated when the laser light cuts the silicon carbide portion.

More particularly, it has been discovered that the laser light works most efficiently when the step of directing the laser light comprises directing light that has a wavelength for which the energy equivalent is equal to or greater than the bandgap of the silicon carbide being cut. Although the applicant does not wish to be bound by any particular theory, it appears that laser light that has a wavelength corresponding to an energy less than the bandgap of the silicon carbide tends to lack efficiency in cutting and vaporizing the silicon carbide, perhaps because of the absorbance conditions, and thus requires extremely high power levels that tend to be more damaging than helpful.

Thus, the step of directing the laser light comprises directing the light with a wavelength of 433 nanometers or less at a portion of 6H silicon carbide, or with a wavelength of 539 nanometers or less at a portion of 3C silicon carbide, which has a bandgap of 2.3 eV. Similarly, for 4H silicon carbide with its bandgap of 3.26 eV, the wavelength should be 380 nanometers or less, and for 15R silicon carbide with its bandgap of 2.99 eV, the wavelength should be 415 nanometers or less.

For gallium nitride and its 3.36 eV bandgap, a wavelength of 369 nm or less is preferred, and the method steps are otherwise either identical or analogous as may be appropriate.

In preferred embodiments of the invention, the step of directing the laser light comprises directing the laser light with a wavelength of 355 nanometers or 266 nanometers. Those familiar with laser devices will recognize that 355 nanometers is the output of a neodymium yttrium aluminum garnet ("Nd:YAG") laser that has been frequency tripled, and 266 nanometers represents the frequency of the same laser quadrupled. The laser should have a power output of at least about 250 milliwatts, and preferably about 800 milliwatts. For a beam with an approximate diameter of about 0.4 mil (1000 mils=1 inch), this produces a power density on the materials being cut of between about 77 and 247 kilowatts per square centimeter.

The characteristics of certain crystalline materials, as well as other techniques for doubling, tripling, quadrupling, or otherwise multiplying the frequency of laser light, is well understood and will not be described in detail otherwise herein. By way of example and not of limitation, however, U.S. Pat. Nos. 3,949,323; 4,884,277; and 5,144,630 are illustrative of some of these characteristics and techniques.

As set forth earlier, one of the disadvantages of laser cutting of semiconductor materials that has prevented it from achieving widespread acceptance to date, is its production of slag material that tends to remain on the surface of the cut semiconductor material, particularly wafers full of device precursors. These byproducts resultingly damage or ruin a lesser or greater percentage of the device precursors on the wafer.

To date, satisfactory techniques for removing the slag have remained unachieved. In the invention, however, it has been discovered that a dry etching step (one that avoids "wet"—i.e., solution—chemistry) will remove the byproducts generated when the laser light cuts the silicon carbide portion. In particular, dry etching appears to remove point defects that form during cutting that would otherwise degrade the color produced by the silicon carbide diodes. In preferred embodiments, the step of dry etching silicon carbide portions includes the step of etching with a fluorine-containing gas such as nitrogen trifluoride, nitrous oxide, ammonium trifluoride, oxygen, sulfur hexafluoride, carbon tetrafluoride, or mixtures thereof. Exemplary techniques for dry etching silicon carbide are set forth in U.S. Pat. Nos. 4,865,685 and 4,981,551 which are incorporated entirely herein by reference. When dry etching gallium nitride, chlorine-containing gases are preferred, such as $Cl_2$ (typically mixed with $H_2$), $BCl_3$, and $SiCl_4$.

As just set forth, the invention can apply to cutting any desired portion of silicon carbide, but most preferably comprises directing the laser light at a single crystal silicon carbide substrate that has at least two epitaxial layers of silicon carbide thereon that define the light-emitting p-n junction therebetween. Most preferably, the method comprises directing the beam of laser light at one surface of a wafer that is formed of a plurality of adjacent silicon carbide light-emitting diode precursors and in which the laser light is directed along the surface of the wafer in a pattern that forms the plurality of trenches between the adjacent light-emitting diode precursors. The wafer is then dry etched as just described to remove byproducts generated when the laser beam cuts the wafer. It will be understood that the laser can cut the wafer from the "front" or the "rear" of the wafer, the front being the device-precursor side and the rear being the substrate side.

The invention can further comprise separating the cut silicon carbide portion along the cuts to form two silicon carbide portions. When a wafer is cut, the method further comprises the step of separating the wafer along the trenches following the step of dry etching the wafer. Such separation forms individual LEDs or groups of LEDs as may be desired. Presently, the separation can be carried out quite straightforwardly using commercially-available separator equipment, an example of which is the DX2+ wafer breaker from Dynatex, Santa Rosa, Calif. Such a commercial device is, of course, exemplary rather than limiting of the technique of the invention.

Because of the efficiency of the method of the invention, it can further comprise the step of applying metal contacts to the diode precursors on the wafer prior to the step of directing the laser light on the wafer. This provides the opportunity and advantage of more efficient planar processing as compared to mesa techniques.

In preferred embodiments of the method, the step of directing the laser light further comprises Q-switching the laser light to thereby texture the walls of the trenches formed by the laser light. As with other aspects of laser techniques, Q-switching is well understood in the laser art and will not be otherwise discussed in detail herein. Preferred switching frequencies are on the order of about one (1) kilohertz, and most preferably about three (3) kilohertz. These switching frequencies provide the maximum power output for the preferred laser light frequencies.

In another aspect, the invention comprises a high efficiency light-emitting diode. Such a diode is broadly illustrated at 10 in FIG. 1. In such an embodiment, the diode 10 comprises a silicon carbide substrate 11 and at least two epitaxial layers shown as the layers 12 and 13 in FIG. 1. It will be understood that there exists device structures that include further or additional epitaxial layers for various purposes. Thus, the illustration and discussion herein of two layers is for purposes of illustrating the invention, and not limiting it.

As illustrated in FIG. 1, the edges of the epitaxial layers 12 and 13 are coincident with the walls of the substrate 11. Stated differently, the invention produces a diode in a non-mesa structure. As stated earlier herein, the mesa structure lowers the number of active devices that can be produced from any given surface area of a wafer. In contrast, the invention greatly increases the potential productivity from wafer precursor structures.

Ohmic contacts 14 and 15 are made to the diode 10 and, although FIG. 1 illustrates the back contact 14 as covering the entire bottom portion of the diode, in preferred embodiments the contact covers less than the entire bottom surface in order to avoid parasitic light absorption. The top contact 15 covers only a small portion of its surface.

The p-n junction produces an emission in the blue region of the visible spectrum when a potential is applied thereacross. The nature and structure of blue light-emitting diodes in silicon carbide is clearly set forth in U.S. Pat. Nos. 4,918,497 and 5,027,168, which are commonly assigned with the present invention, and which are incorporated entirely herein by reference. In particular, in a blue light-emitting diode, the junction, designated at 16, produces an emission of between about 450 and 490 nanometers. In preferred embodiments of the invention, the epitaxial layers can comprise either silicon carbide or gallium nitride consistent with the structures set forth in the incorporated patent references.

When the invention is incorporated in a green light-emitting diode (e.g., "True Green Light-Emitting Diode Formed in Silicon Carbide," Ser. No. 08/290,020, filed Aug. 12, 1994, and incorporated entirely herein by reference), the junction will produce an emission of between about 520 and 540 nanometers. In a gallium nitride diode, the emission will be between about 350 and 550 nanometers.

In preferred embodiments, the walls of the epitaxial layers, and if desired of the substrate 11, are reticulate; i.e., they have a patterned surface. The method step of the invention referred to as "Q-switching" earlier can produce such reticulated edges with the most analogous description (although certainly not a limiting one) being that of drilling a series of holes one after another to form a longitudinal cut. The edges of such a cut would more nearly resemble the edges of a drilled cylinder hole rather than a mirror-like surface. As set forth in the background, the smooth surfaces produced by diamond saws and other mechanical cutting techniques tend to encourage internal reflection of light, rather than external emission. Thus, the laser cutting technique of the present invention enhances the efficiency of the resulting device by producing such reticulate edges where desired.

Figure 2:
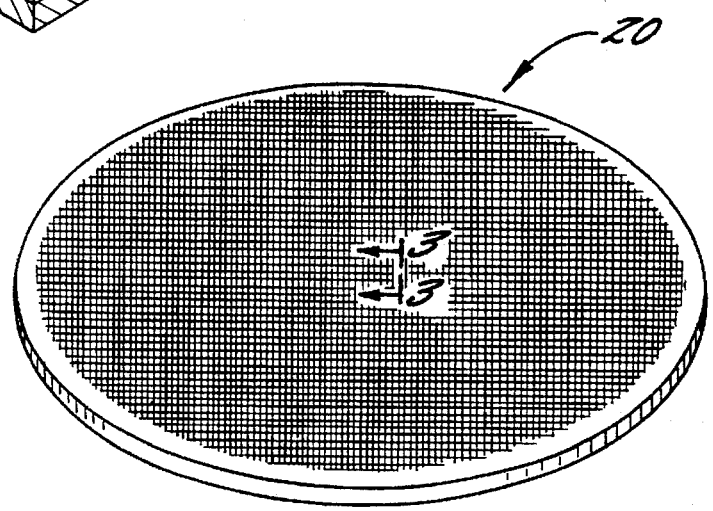
FIG. 2 is a perspective view of a wafer of diode precursors according to the present invention.
Figure 3:
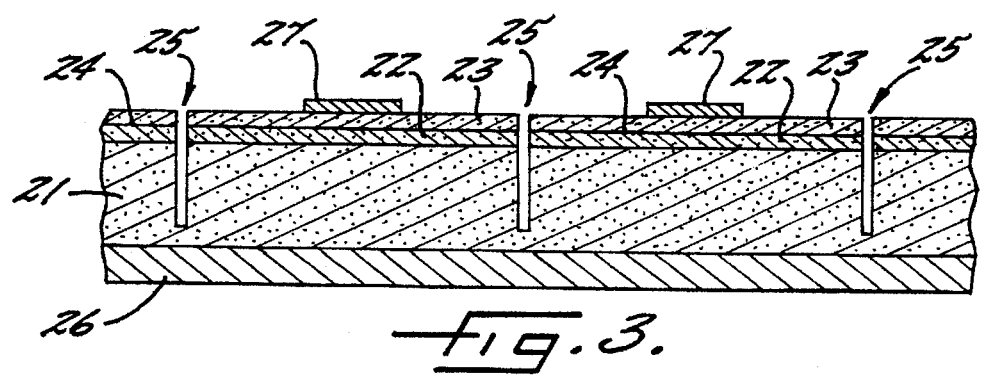
FIG. 3 is a cross-sectional view taken along lines 3—3 of FIG. 2 and illustrating the substrate, the epitaxial layers, and the trenches.

In yet another aspect, the invention comprises a silicon carbide light-emitting diode precursor structure shown as the wafer broadly designated at 20 in FIG. 2. FIG. 3 is an enlarged cross-sectional view of the wafer 20 and illustrates that the wafer includes a silicon carbide substrate 21 with at least two epitaxial layers 22 and 23 thereon that define a p-n junction 24 therebetween. An exemplary wafer includes a plurality of trenches 25 that have reticulate side walls. Furthermore, in an exemplary embodiment the trenches have an aspect ratio of 6:1 in an 8.5 mil thick wafer, which is greater than the aspect ratio that can be accomplished with a diamond saw in such a thin wafer. A high aspect ratio offers a number of advantages. These include a greater wall exposure and its resulting increase in efficiency, as well as the ability to form a larger number of devices from any given size of wafer.

FIG. 3 is not necessarily illustrated to scale, but in typical embodiments of the invention, the wafer has a thickness of about 8.5 mils, and the trenches are about 1 mil wide and 6 mils deep. The precursor structure can further include metallization shown in FIG. 3 as a back contact 26 and the ohmic top contacts 27.

As in the previous embodiments, the epitaxial layers can comprise silicon carbide or gallium nitride.

Although the term "gallium nitride" has been used herein, it will be understood that the invention applies to a variety of Group III nitrides such as those described in U.S. Pat. No. 5,523,589 filed Sep. 20, 1994 for "Vertical Geometry Light Emitting Diode with Group III Nitride Active Layer and Extended Lifetime;" and copending application Ser. No. 08/309,247 also filed Sep. 20, 1994 for "Low-Strain Laser Structures with Group III Nitride Active Layers," which are incorporated entirely herein by reference as the techniques described herein will apply to the production of such devices as well as to devices that are entirely formed in silicon carbide. Similarly, the method aspects of the invention can apply to all sorts of devices and are not limited to the exemplary LEDs discussed herein.

Furthermore, a number of techniques for growing bulk single crystals of silicon carbide and epitaxial layers of silicon carbide are described in previous patents commonly assigned or exclusively licensed to the assignee of this application. These exemplary patents include those for bulk single crystal growth (U.S. Pat. No. 4,866,005), epitaxial growth (U.S. Pat. No. 4,912,064), dry etching of silicon carbide (U.S. Pat. Nos. 4,865,685 and 4,981,551), and particular structures of light-emitting diodes (U.S. Pat. Nos. 4,918,497; 5,027,168; and 5,338,944).

In the specification there have been set forth preferred and exemplary embodiments of the invention, and the same are illustrative of the invention and not limiting thereof, the scope of the invention being set forth in the following claims.

That which is claimed is:

1. A method of producing light emitting diodes from silicon carbide with increased external efficiency, the method comprising:

directing a beam of laser light at one surface of a portion of silicon carbide, and in which the laser light has a wavelength for which the energy equivalent is equal to or greater than the bandgap of the silicon carbide and is sufficient to vaporize the silicon carbide that it strikes to thereby define a cut in the silicon carbide portion; and dry etching the silicon carbide portion to remove by-products generated when the laser light cuts the silicon carbide portion.

2. A method according to claim 1 wherein the step of directing the laser light comprises directing light with a wavelength of 433 nm or less at a portion of 6H silicon carbide.

3. A method according to claim 1 wherein the step of directing the laser light comprises directing laser light with a wavelength of 355 nm.

4. A method according to claim 1 wherein the step of directing the laser light comprises directing laser light with a wavelength of 266 nm.

5. A method according to claim 1 wherein the step of directing the laser light comprises directing light with a wavelength of 539 nm or less at a portion of 3C silicon carbide.

6. A method according to claim 1 wherein the step of directing the laser light comprises directing light with a wavelength of 380 nm or less at a portion of 4H silicon carbide.

7. A method according to claim 1 wherein the step of directing the laser light comprises directing light with a wavelength of 415 nm or less at a portion of 15R silicon carbide.

8. A method according to claim 1 wherein the step of dry etching the silicon carbide portion comprises reactive ion etching.

9. A method according to claim 8 wherein the step of reactive ion etching comprises reactive ion etching using a fluorine-containing gas.

10. A method according to claim 1 wherein the step of directing the laser light at a silicon carbide portion comprises directing the laser light at a single crystal silicon carbide substrate that has at least two epitaxial layers of silicon carbide thereon that define a p-n junction therebetween.

11. A method according to claim 1 and further comprising separating the cut silicon carbide portion along the cut to form two silicon carbide portions.

12. A method according to claim 1 wherein the step of directing the laser beam comprises Q-switching the laser beam.

13. A method of producing light emitting diodes from silicon carbide with increased external efficiency, the method comprising:

directing a beam of laser light at one surface of a wafer formed of a plurality of adjacent silicon carbide light emitting diode precursors, and in which the laser light has a wavelength for which the energy equivalent is equal to or greater than the bandgap of the silicon carbide and is sufficient to vaporize the silicon carbide that it strikes to thereby define a cut in the silicon carbide portion;

directing the laser light along the surface of the wafer in a pattern that forms a plurality of trenches between the adjacent light emitting diode precursors; and dry etching the wafer to remove by-products generated when the laser beam cuts the wafer.

14. A method according to claim 13 wherein the step of directing a beam of laser light at one surface of the wafer comprises directing a beam at the rear substrate surface of the wafer.

15. A method according to claim 13 wherein the step of directing a beam of laser light at one surface of the wafer comprises directing a beam at the front device surface of the wafer.

16. A method according to claim 13 further comprising the step of separating the wafer along the trenches following the step of dry etching the wafer.

17. A method according to claim 13 further comprising the step of applying metal contacts to the diode precursors on the wafer prior to the step of directing the laser light on the wafer.

18. A method according to claim 13 wherein the step of directing the laser light comprises directing light with a wavelength of 433 nm or less at a portion of 6H silicon carbide.

19. A method according to claim 13 wherein the step of directing the laser light comprises directing light with a wavelength of 539 nm or less at a portion of 3C silicon carbide.

20. A method according to claim 13 wherein the step of directing the laser light comprises directing light with a wavelength of 380 nm or less at a portion of 4H silicon carbide.

21. A method according to claim 13 wherein the step of directing the laser light comprises directing light with a wavelength of 415 nm or less at a portion of 15R silicon carbide.

22. A method according to claim 13 wherein the step of directing the laser light comprises directing laser light with a wavelength of 355 nm.

23. A method according to claim 13 wherein the step of directing the laser light comprises directing laser light with a wavelength of 266 nm.

24. A method according to claim 13 wherein the step of directing the laser beam comprises Q-switching the laser beam.

25. A method of producing light emitting diodes from silicon carbide with increased external efficiency, the method comprising:

directing a beam of laser light at one surface of a wafer formed of a plurality of adjacent gallium nitride light emitting diode precursors, and in which the laser light has a wavelength for which the energy equivalent is equal to or greater than the bandgap of the gallium nitride and is sufficient to vaporize the gallium nitride that it strikes to thereby define a cut in the gallium nitride;

directing the laser light along the surface of the wafer in a pattern that forms a plurality of trenches between the adjacent light emitting diode precursors; and dry etching the wafer to remove vaporized by-products generated when the laser beam cuts the wafer.

26. A method according to claim 25 further comprising the step of separating the wafer along the trenches following the step of dry etching the wafer.

27. A method according to claim 25 further comprising the step of applying metal contacts to the diode precursors on the wafer prior to the step of directing the laser light on the wafer.

28. A method according to claim 25 wherein the step of directing the laser light comprises directing light with a wavelength of 369 nm or less at a portion of gallium nitride.

29. A method according to claim 25 wherein the step of directing the laser light comprises directing laser light with a wavelength of 266 nm.

30. A method according to claim 25 wherein the step of directing the laser light further comprises q-switching the laser light.

* * * * *